United States Patent [19]

Hurley et al.

[11] 4,155,803

[45] May 22, 1979

[54] CHEMICAL ABLATION OF SINGLE CRYSTAL ALKALINE EARTH METAL HALIDE

[75] Inventors: Michael D. Hurley, Farmington Hills, Mich.; Pierino I. Zapella, Huntington Beach, Calif.

[73] Assignees: Ford Motor Company; Ford Aerospace & Communications Corp., both of Dearborn, Mich., a part interest.

[21] Appl. No.: 859,890

[22] Filed: Dec. 12, 1977

[51] Int. Cl.² .................................. H01L 21/306
[52] U.S. Cl. ................................. 156/647; 156/659; 252/79.2
[58] Field of Search ............... 156/647, 654, 659, 662; 252/79.1, 79.2

[56] References Cited

U.S. PATENT DOCUMENTS

| | | | |
|---|---|---|---|
| 3,765,969 | 10/1973 | Kragness et al. | 156/648 X |
| 3,935,302 | 1/1976 | Pastor et al. | 423/490 |

OTHER PUBLICATIONS

Indian Journal of Pure and Applied Physics, vol. 11, No. 12, Dec. 1973, pp. 939 and 940, Selective Etching Parameters for $CaF_2$ Single Crystal.
Journal of Applied Physics, vol. 47, No. 2, Feb. 1976, Preparation of Polished Substrates of $BaF_2$ by Bis et al., pp. 736–740.
Optical Engineering, vol. 14, No. 4, Jul.–Aug. 1975, Recent Infrared Detector Developments for Future Remote Sensor Applications, pp. 351–356.

Primary Examiner—William A. Powell
Attorney, Agent, or Firm—Edmund C. Ross, Jr.; Olin B. Johnson

[57] ABSTRACT

Ablation of single crystal alkaline earth metal halides as barium fluoride is accomplished by contacting them with monovalent acid in fluid medium. Smooth etched surfaces are obtained by hydrogen halide as hydrochloric acid in aqueous solution acting on single crystal barium fluoride.

1 Claim, No Drawings

CHEMICAL ABLATION OF SINGLE CRYSTAL ALKALINE EARTH METAL HALIDE

BACKGROUND OF THE INVENTION

This invention relates to chemical ablation of metal halide salt and includes, in particular etching as well as cutting alkaline earth metal halide as single crystal barium fluoride.

Metal halides especially single crystal alkaline earth metal halides, have application as insulators, windows and substrates in devices such as photovoltaic diodes, lasers, transistors and charge coupled devices. For example, single crystal barium fluoride is used as a substrate with Group Iv–VI semiconductor diodes to provide detectors of infrared radiation in thermal imaging systems (see, for example, U.S. patent application Ser. No. 781,377, filed Mar. 25, 1977, now U.S. Pat. No. 4,080,723 which is herein hereby incorporated by reference).

When employing metal halide salt such as single crystal barium fluoride as a substrate for such diode devices or in other applications, it becomes necessary at times to etch, cut or otherwise ablate a portion of the salt. In the past, this has been accomplished mechanically as by cleaving along certain crystal planes or sawing with diamond impregnated blades (see U.S. Pat. No. 3,935,302, column 4, lines 52–55. In making thermal imaging systems, as above noted, one current concern is removal of the unworked periphery of single crystal substrates having a center section of diode elements so as to maximize effective operating area. Use of diamond impregnated blades to mechanically saw the substrate perifery, however, can cause undesired chipping, cracking, etc. that result in loss of the usefulness of the device after it has had substantial processing.

THE INVENTION

This invention provides a simple procedure whereby metal halide salt is chemically ablated by contacting it with monovalent acid, preferably hydrogen halide acid such as hydrochloric acid or hydrogen bromide. Advantageously, the ablation can be carried out under conditions that do not adversely effect conventional positive or negative photoresist used to mask the substrate or semiconductor or portions thereof.

DETAILED DESCRIPTION OF THE INVENTION

Optimum results obtained so far with the method herein are with metal halides comprising single crystal barium fluoride although the chemical ablator is found to etch or otherwise dissolve other single crystal alkaline earth metal halides such as calcium fluoride and strontium fluoride. These single crystals are well known and commercially available, and may include small amounts of other ions, e.g., OH− and the like.

Monovalent acids, including especially inorganic acids as nitric acid as well as halogen containing acids as preferred hydrochloric acid, are found to chemically ablate the metal halide salt in aqueous solution. Divalent acids as sulfuric acid have not been seen as providing a noticeable ablation of single crystal alkaline earth metal salts under similar conditions.

With single crystal barium fluoride, use of an aqueous solution of hydrogen halide acid as hydrochloric acid not only has the advantage of rapid etching at temperatures in a relatively low range desirably below about 150° C. (e.g. more preferably about 50–100° C.) that do not cause adverse baking or reaction of conventional photoresist, but also the advantage of convenient removal by acqueous hydrochloric acid solutions (as distinguished from aqueous solutions of certain other acids as nitric acid acting on single crystal barium fluoride) appear to etch single crystal barium fluoride consistently along differing crystal planes and provide a smooth surface after etching.

Although water is conveniently used as a liquid medium for ablation of the single crystals, it is apparent that liquids other than water or combinations of water and organic materials may be employed in contacting the halide salt with the acid. Moreover, vapor phase contact by, for instance, hydrogen chloride, should also be useful. Such vapor phase contact may be accomplished as by atomizing the aqueous acid.

In one embodiment, negative or positive photoresist is applied onto the surface of a single crystal alkaline earth metal halide and thereafter delineated by conventional methods. In this embodiment, the single crystal alkaline earth metal halide, e.g. $BaF_2$, acting as substrate for a photovoltaic diode, may be in a range of about 200–1000 microns thick, discounting deposited semiconductor. The portions of the substrate free of photoresist after delineation are those which are to be etched, cut, etc. by the acid. The substrate is immersed in aqueous solution of acid, preferably hydrochloric acid at a preferred concentration of about 2–25% by weight acid, whereupon etching begins. Upon completion, the remaining photoresist is removed.

If cutting of the substrate into two or more pieces is desired, areas of photoresist can be removed, prior to ablation, to provide a narrow (e.g. less than 1000 microns wide) channel for etching on either or both sides of the substrates. If etching of only a portion as removal of a portion of the metal halide salt is desired, then such area of photoresist is removed before etching.

After the desired ablation has taken place, the ablated substrate is preferably washed in water, preferably distilled water, in order to aid in removal of impurities on the substrate. This washing is typically at room temperature, e.g. 20° C.

The ablated surfaces of the single crystals in certain embodiments are smooth indicating a uniform etch along differing crystal planes. In other embodiments as etching with nitric acid, there is an apparent preferential etch that is noted by diffraction zones in the light beam used to measure etch depth. For example, nitric acid acting on single cruystal barium fluoride leaves pyramidal discontinuties along the etched surface when etching along the (111) plane. These substrates with discontinuities may be acceptable in certain circumstances.

Smooth surfaces, however, are attainable with hydrogen halide particularly, for example, hydrogen chloride in aqueous solution acting on barium fluoride. In effect, there appears to be a chemical polishing of the substrate remaining after etch.

EXAMPLE

Etching rate of single crystal alkaline earth metal halide using various etching solutions are determined according to the following procedure.

Etchant A—1 part by volume aqueous concentrated hydrochloric acid (about 37% by weight active) and 3 parts volume distilled water.

Etchant B—1 part concentrated aqueous hydrochloric acid (about 37% by weight active) and 3 parts volume of an aqueous solution comprising 100 grams urea per liter.

Etchant C—1 part by volume concentrated aqueous hydrochloric acid (about 37% by weight active) and 3 parts by volume of an aqueous solution comprising 100 grams thiourea per liter.

Etchant D—1 part by volume concentrated sulfuric acid (about 96% by weight active) and 3 parts by volume distilled water.

Etchant E—1 -part by volume concentrated nitric acid (about 70% by weight active) and 3 parts by volume distilled water.

Etchant F—1 part by volume hydrobromic acid (about 48% by weight active) and 3 parts by volume distilled water.

Etchant G—1 part by volume hydrofluoric acid (49% by weight active) and 3 parts by volume distilled water.

Etchant H—1 part by volume glacial acetic acid and 3 parts by volume distilled water.

The following single crystals were used: $BaF_2$; $CaF_2$; and $SrF_2$; all are obtaned from Harshaw Chemical Co. The crystal samples were approximately 1 cm.×1 cm.×500 microns made by cleaving a 1 cm.×1 cm. block along the (111) plane.

Half of the planar surface of one side of the cleaved substrate was coated with positive photoresist (obtained from Shippley as 1350-J) by coating the whole surface, exposing half of the coated surface to ultraviolet light, and removing the exposed photoresist. The coated crystals were then immersed in 40 ml. of stirred etchant solution maintained at 60° C. After 15 seconds, the crystals were removed, washed in distilled water and then dried. Acetone was used to strip off the unexposed photoresist.

A Watson interferometer was used to measure the depth of the etch.

The etch rate using single crystal barium fluoride was as follows:

| Etchant Solution | Etchant Rate |
| --- | --- |
| Etchant A | 45 microns/minute |
| Etchant B | 35 microns/minute |
| Etchant C | 25 microns/minute |
| Etchant D | no apparent etch |
| Etchant E | 21 microns/minute* |
| Etchant F | 13 microns/minute* |
| Etchant G | 0.24 microns/minute** |
| Etchant H | 1.08 microns/minute |

*uneveness of etched surface noted indicating differing etch rate depending on crystallographic plane.
**appears to interact with photoresist and leave film on substrate after removal of photoresist suggesting possible etching under photoresist thereby making measurement somewhat unreliable.

The etch rate of single crystal calcium fluoride as substrate using Etchant C was 0.22 microns/minute; however, some directional etching noted.

The etch rate of single crystal strontium fluoride as substrate using Etchant C was 0.75 microns/minute.

What is claimed is:

1. A method of cutting a single crystal barium fluoride crystal substrate chemically wherein the substrate is about 200–1000 microns thick and has been cleaved along its (111) plane, which method comprises
   (A) delineating the substrate with photoresist to leave a portion of the substrate free of the photoresist;
   (B) immersing at least the portion free of photoresist in aqueous acid at a temperature in a range of about 50°–100° C. comprising monovalent acid selected from the group consisting of hydrogen chloride, hydrogen bromide, nitric acid and mixtures thereof for a time sufficient to chemically cut the substrate;
   (C) washing the cut substrate.

* * * * *